US011716843B2

(12) United States Patent
Yang et al.

(10) Patent No.: US 11,716,843 B2
(45) Date of Patent: Aug. 1, 2023

(54) METHOD FOR FORMING CONTACT STRUCTURES IN THREE-DIMENSIONAL MEMORY DEVICES

(71) Applicant: Yangtze Memory Technologies Co., Ltd., Hubei (CN)

(72) Inventors: Han Yang, Hubei (CN); Fanqing Zeng, Hubei (CN); Fushan Zhang, Hubei (CN); Qianbing Xu, Hubei (CN); Enbo Wang, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 192 days.

(21) Appl. No.: 17/015,213

(22) Filed: Sep. 9, 2020

(65) Prior Publication Data

US 2021/0296346 A1  Sep. 23, 2021

Related U.S. Application Data

(63) Continuation of application No. PCT/CN2020/080151, filed on Mar. 19, 2020.

(51) Int. Cl.
*H10B 43/20* (2023.01)
*H10B 41/20* (2023.01)
(Continued)

(52) U.S. Cl.
CPC .......... *H10B 43/20* (2023.02); *H10B 41/20* (2023.02); *H10B 41/35* (2023.02); *H10B 43/35* (2023.02)

(58) Field of Classification Search
CPC ......... H01L 27/11578; H01L 27/11524; H01L 27/11551; H01L 27/1157; H01L 27/11575;
(Continued)

(56) References Cited

U.S. PATENT DOCUMENTS 7,524,593 B2  4/2009 Ohnuma
8,853,066 B2  10/2014 Chen et al.
(Continued)

FOREIGN PATENT DOCUMENTS

CN      1912740 A    2/2007
CN    101473434 A    7/2009
(Continued)

OTHER PUBLICATIONS

Chinese Application No. 202080000655.2, Office Action dated Jan. 13, 2021; 19 pages.
(Continued)

*Primary Examiner* — Shahed Ahmed
*Assistant Examiner* — Khatib A Rahman
(74) *Attorney, Agent, or Firm* — Sterne, Kessler, Goldstein & Fox P.L.L.C.

(57) ABSTRACT

Embodiments of 3D memory structures and methods for forming the same are disclosed. The fabrication method includes forming multiple openings in staircase regions, periphery device regions, and substrate contact regions of a 3D NAND memory device. The openings can be formed by a photolithography process followed by multiple etching processes. The openings can include complete openings that expose the underlying layer and mid-way openings where a remaining portion of the photoresist still exists between the opening and the underlying layer. The remaining portion of the photoresist can delay the etching process in the shorter openings for the upper level staircase structure during the formation of the deeper openings for the lower level staircase structure. Conductive material is deposited into the openings to form contact structures for structures such as substrate contact pads, upper and lower level staircase structures, and/or peripheral devices.

22 Claims, 10 Drawing Sheets

(51) Int. Cl.
*H10B 41/35* (2023.01)
*H10B 43/35* (2023.01)

(58) Field of Classification Search
CPC ............ H01L 27/11582; H01L 27/115; H01L 27/11529; H01L 27/11556; H01L 27/11573; H10B 43/20; H10B 41/20; H10B 41/35; H10B 43/35; H10B 43/27; H10B 43/50; H10B 69/00; H10B 41/27; H10B 41/41; H10B 43/40
See application file for complete search history.

(56) References Cited

U.S. PATENT DOCUMENTS

| | | | |
|---|---|---|---|
| 10,658,378 B2* | 5/2020 | Tao | H01L 27/11565 |
| 10,748,634 B2 | 8/2020 | Kim et al. | |
| 10,763,275 B2 | 9/2020 | Hu et al. | |
| 10,770,468 B2* | 9/2020 | Wang | H01L 23/5226 |
| 10,818,678 B2 | 10/2020 | Hwang et al. | |
| 10,825,929 B2* | 11/2020 | Sun | G11C 16/0466 |
| 2009/0267234 A1 | 10/2009 | Nguyen Hoang | |
| 2015/0132919 A1 | 5/2015 | Chang et al. | |
| 2016/0343748 A1 | 11/2016 | Wang et al. | |
| 2019/0067314 A1 | 2/2019 | Lu et al. | |
| 2019/0157280 A1* | 5/2019 | Wang | H01L 21/02271 |
| 2020/0043943 A1 | 2/2020 | Kang et al. | |
| 2020/0066703 A1 | 2/2020 | Kim et al. | |
| 2020/0227555 A1* | 7/2020 | Sun | G11C 16/0466 |
| 2021/0104532 A1* | 4/2021 | Pu | H01L 27/0605 |
| 2021/0287991 A1* | 9/2021 | Sun | H01L 21/76805 |
| 2021/0296336 A1* | 9/2021 | Xue | H01L 27/11582 |

FOREIGN PATENT DOCUMENTS

| | | |
|---|---|---|
| CN | 103811417 A | 5/2014 |
| CN | 104576542 A | 4/2015 |
| CN | 106206447 A | 12/2016 |
| CN | 108735760 A | 11/2018 |
| CN | 109326602 A | 2/2019 |
| CN | 109473433 A | 3/2019 |
| CN | 109524417 A | 3/2019 |
| CN | 110100307 A | 8/2019 |
| CN | 110121775 A | 8/2019 |
| CN | 110729295 A | 1/2020 |
| CN | 110767743 A | 2/2020 |
| CN | 110797345 A | 2/2020 |
| CN | 110800109 A | 2/2020 |
| JP | 2005203496 A | 7/2005 |
| TW | 201947706 A | 12/2019 |
| WO | WO 2019/100875 A1 | 5/2019 |

OTHER PUBLICATIONS

Abstract of Yan Shu Hua, "Diffractive Micro-Optics Design," ISBN: 978-7-118-07224-2, Publisher: National Defense Industry Press 2011 Beijing, with attached machine translation of abstract available at: https://www.amazon.com/Diffractive-micro-optics-design-Chinese-YAN/dp/B0058BDHL0, downloaded Jan. 25, 2021, 10.

Abstract of Hans Peter Herzig, "Micro-Optics Elements, Systems and Applications," Taylor & Francis Ltd. 1997, available at: https://www.routledge.com/Micro-Optics-Elements-Systems-And-Applications/Herzig/p/book/9780748404810; downloaded Jan. 25, 2021; 5 pages.

* cited by examiner

METHOD FOR FORMING CONTACT STRUCTURES IN THREE-DIMENSIONAL MEMORY DEVICES

CROSS-REFERENCE TO RELATED APPLICATIONS

This application claims priority to PCT Patent Application No. PCT/CN2020/080151, filed on Mar. 19, 2020, which is incorporated herein by reference in its entirety.

TECHNICAL FIELD

The present disclosure generally relates to the field of semiconductor technology, and more particularly, to a method for forming a three-dimensional (3D) memory device.

BACKGROUND

Planar memory cells are scaled to smaller sizes by improving process technology, circuit design, programming algorithm, and fabrication process. However, as feature sizes of the memory cells approach a lower limit, planar process and fabrication techniques become challenging and costly. As such, memory density for planar memory cells approaches an upper limit. A three-dimensional (3D) memory architecture can address the density limitation in planar memory cells.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
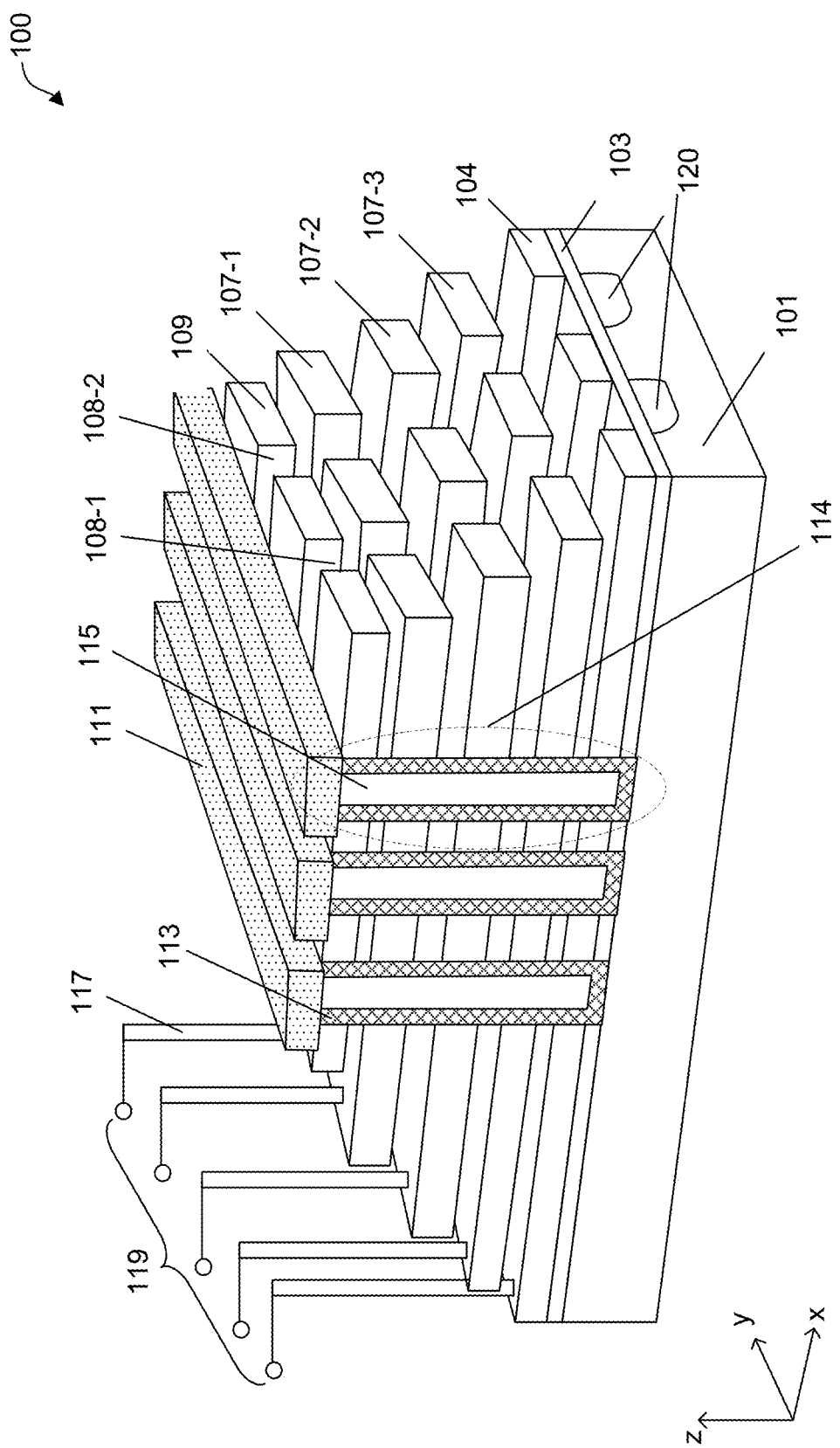
FIG. 1 illustrates a 3D NAND memory structure, in accordance with some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnection layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically-oriented strings of memory cell transistors (i.e., region herein as "memory strings," such as NAND strings) on a laterally-oriented substrate so that the memory strings extend in the vertical direction with respect to the substrate. As used herein, the term "vertical/vertically" means nominally perpendicular to a lateral surface of a substrate.

Lithography and etching processes can be used to open contact areas for forming electrical connection in semiconductor structures, such as openings for forming contacts for word lines, peripheral devices, or substrate contacts. For example, in a 3D NAND memory device, electrical connections such as word line contacts are formed by disposing conductive material in openings and connected to the conductive layer on each level of the staircase structure. Electrical connections are also formed to connect peripheral circuitry to other device/structures. Other layers and structures such as metal layers and vias are formed on the staircase structure and peripheral circuitry. Exemplary vias can include via 0 connecting the electrical contacts to the MO metal lines. MO metal lines can be a local interconnect that represents a first interconnect level and electrically connects to an underlying semiconductor device through a via. Other metal lines can be formed in the metal layers.

Lithography processes for forming vias in 3D NAND memory devices include using a lithographic apparatus, which is a machine that applies a desired pattern onto a substrate, usually onto a target portion of the substrate. For example, lithographic apparatus can include a patterning device, which is alternatively referred to as a mask or a reticle, used to generate a circuit pattern to be formed on an individual layer of the integrated circuit. This pattern can be aligned to a target portion (e.g., staircase structure or peripheral circuitry) on a substrate (e.g., a 3D NAND memory device) and transferred onto the target portion. Transfer of the pattern is typically performed by imaging a pattern onto a layer of radiation-sensitive material (photoresist) provided on the substrate.

As the demand for higher storage capacity continues to increase, the number of vertical levels of the memory cells and staircase structures also increases. For example, a 64-level 3D NAND memory device can include two 32-level staircase structures with one formed on top of the other. Similarly, a 128-level 3D NAND memory device can include two 64-level staircase structures. As device critical dimensions continue to shrink, it is increasingly more challenging to etch openings for forming contact structures, such as word line contacts. Using a 64-level 3D NAND memory device as an example, word line contacts for the upper and lower level 32-level staircase structures require openings that have different depths to be formed. Similarly, a contact structure for a substrate contact can traverse the entire height of the two 32-level staircase structures and would require an opening with much higher aspect ratio than the openings formed for fabricating word line contact for the top 32-level staircase structure. The formation of openings with higher aspect ratio can cause over etch in openings with lower aspect ratio, which in turn can lead to device failure. Accordingly, it is challenging to balance the manufacturing throughput and the process complexity/cost.

To address the above shortcomings, embodiments described herein are directed to contacting structures of a 3D NAND memory device and fabricating methods of the same. The exemplary fabrication method includes forming multiple openings such as target via holes in staircase regions, periphery device regions, and substrate contact regions of a 3D NAND memory device. The openings can be formed by a photolithography process followed by multiple etching processes. The photolithography process can utilize various methods to form a plurality of openings in a photoresist layer and the openings can include complete openings that expose the underlying layer and mid-way openings where a remaining portion of the photoresist still exists between the opening and the underlying layer. The remaining portion of the photoresist can delay the etching process in the shorter openings for the upper level staircase structure during the formation of the deeper openings for the lower level staircase structure. The complete openings and mid-way openings can be formed by various methods, such as varying the exposure amount in certain regions of the reticle or incorporating light absorbing or transmit-enhancing films on certain regions of the reticle. In some embodiments, a half-tone reticle can be used that has different transmittances, e.g., that allows greater transmission of light of selected wavelengths over other wavelengths. For example, a half-tone reticle contains areas that are transparent to ultraviolet (UV) radiation and also areas that are semi-transparent to UV radiation.

Before describing in detail methods for forming contacts in 3D NAND memory devices, an exemplary 3D NAND flash memory device is illustrated in FIG. 1. The flash memory device includes a substrate 101, an insulating layer 103 over substrate 101, a tier of bottom select gate electrodes 104 over insulating layer 103, and a plurality of tiers of control gate electrodes 107 (e.g., 107-1, 107-2, and 107-3) stacking on top of bottom select gate electrodes 104. Flash memory device 100 also includes a tier of top select gate electrodes 109 over the stack of control gate electrodes 107, doped source line regions 120 in portions of substrate 101 between adjacent bottom select gate electrodes 104, and semiconductor channels 114 through top select gate electrodes 109, control gate electrodes 107, bottom select gate electrodes 104, and insulating layer 103. Semiconductor channel 114 (illustrated by a dashed eclipse) includes a memory film 113 over the inner surface of semiconductor channel 114 and a core filling film 115 surrounded by memory film 113 in semiconductor channel 114. The flash memory device 100 further includes a plurality of bitlines 111 disposed on and connected to semiconductor channels 114 over top select gate electrodes 109. A plurality of metal interconnects 119 are connected to the gate electrodes (e.g., 104, 107, and 109) through a plurality of metal contacts 117. During device fabrication, metal interconnects 119 are aligned and connected to metal contacts 117. In some embodiments, metal contacts 117 can be vias formed in insulating layers that are formed between adjacent tiers of gate electrodes. Insulating layers are not shown in FIG. 1 for simplicity. The gate electrodes can also be referred to as the word lines, which include top select gate electrodes 109, control gate electrodes 107, and bottom select gate electrodes 104.

In FIG. 1, for illustrative purposes, three tiers of control gate electrodes 107-1, 107-2, and 107-3 are shown together with one tier of top select gate electrodes 109 and one tier of bottom select gate electrodes 104. Each tier of gate electrodes have substantially the same height over substrate 101. The gate electrodes of each tier are separated by gate line slits 108-1 and 108-2 through the stack of gate electrodes. Each of the gate electrodes in a same tier is conductively connected to a metal interconnect 119 through a metal contact 117. That is, the number of metal contacts formed on the gate electrodes equals the number of gate electrodes (i.e., the sum of all top select gate electrodes 109, control gate electrodes 107, and bottom select gate electrodes 104). Further, the same number of metal interconnects is formed to connect to each metal contact 117.

For illustrative purposes, similar or same parts in a 3D NAND memory device are labeled using same element numbers. However, element numbers are merely used to distinguish relevant parts in the Detailed Description and do not indicate any similarity or difference in functionalities, compositions, or locations. The structures 200-900 illustrated in FIGS. 2-9 are each portions of a 3D NAND memory device. Other parts of the memory device are not shown for ease of description. Although using a 3D NAND device as an example, in various applications and designs, the disclosed structure can also be applied in similar or different semiconductor devices to, e.g., reduce the leakage current between adjacent word lines. The specific application of the disclosed structure should not be limited by the embodiments of the present disclosure. For illustrative purposes, word lines and gate electrodes are used interchangeably to describe the present disclosure. In various embodiments, the number of layers, the methods to form these layers, and the specific order to form these layers may vary according to different designs and should not be limited by the embodiments of the present disclosure. It should be noted that the "x" and "y" directions illustrated in these figures are for clarity purposes and should not be limiting.

Figure 9:
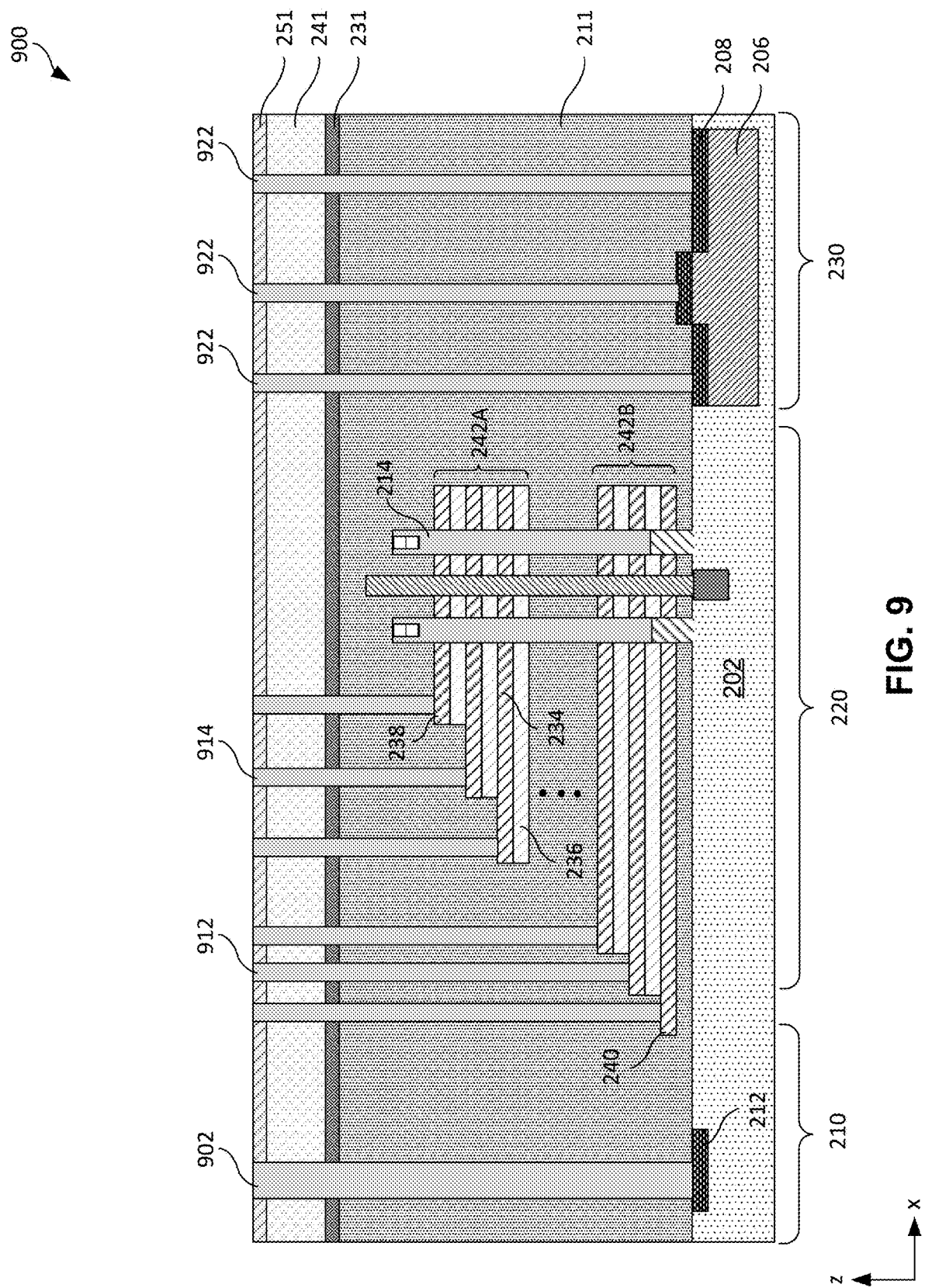
Figure 10:
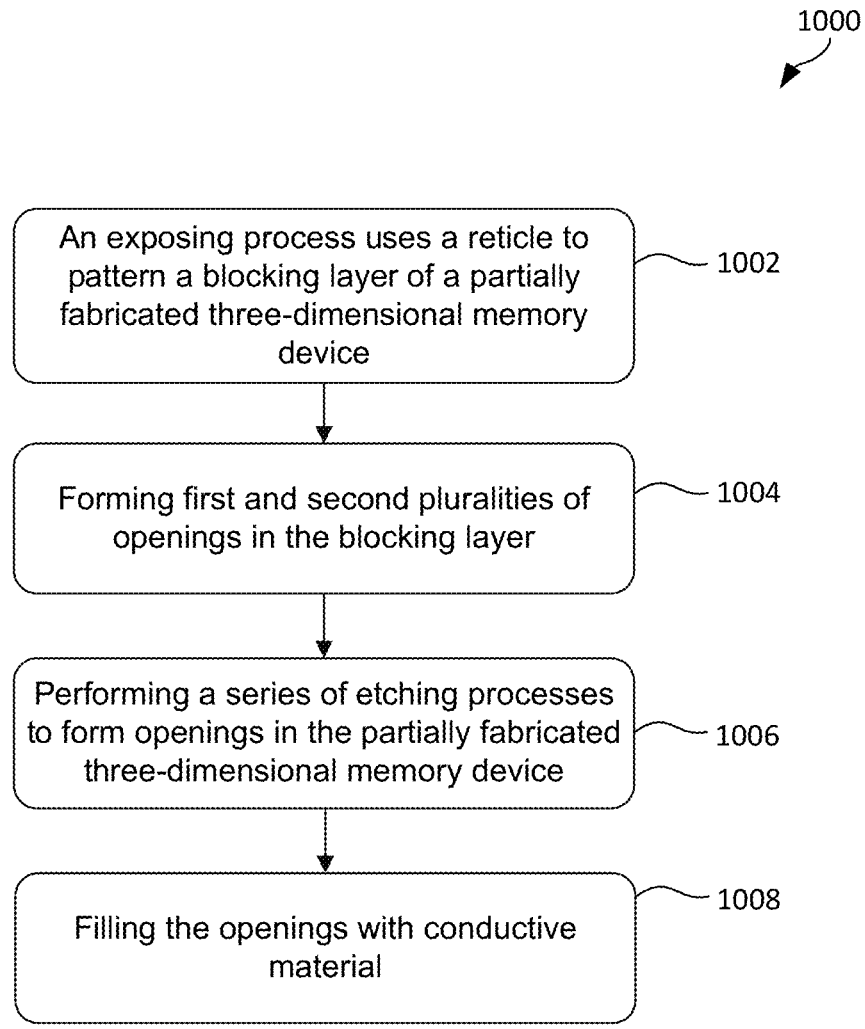
FIG. 10 is a flow diagram illustrating exemplary methods for forming contact structures in 3D NAND memory structures, in accordance with some embodiments of the present disclosure.

Exemplary configuration and fabrication processes of word line and peripheral contacts including contact pads are described further in detail below with reference to FIGS. 2-10. Exemplary structures and fabrication processes shown in FIGS. 2-10 can be directed to forming 3D NAND memory devices. The 3D NAND memory devices can include word line staircase regions extending in any suitable direction such as, for example, positive y direction, negative y direction, positive x direction, negative x direction, and/or any suitable directions. FIG. 10 is a flow diagram of an exemplary method 1000 of forming conductive structures in 3D NAND memory devices, in accordance with some embodiments of the present disclosure. Based on the disclosure herein, operations in method 1000 can be performed in a different order and/or vary.

Figure 2:
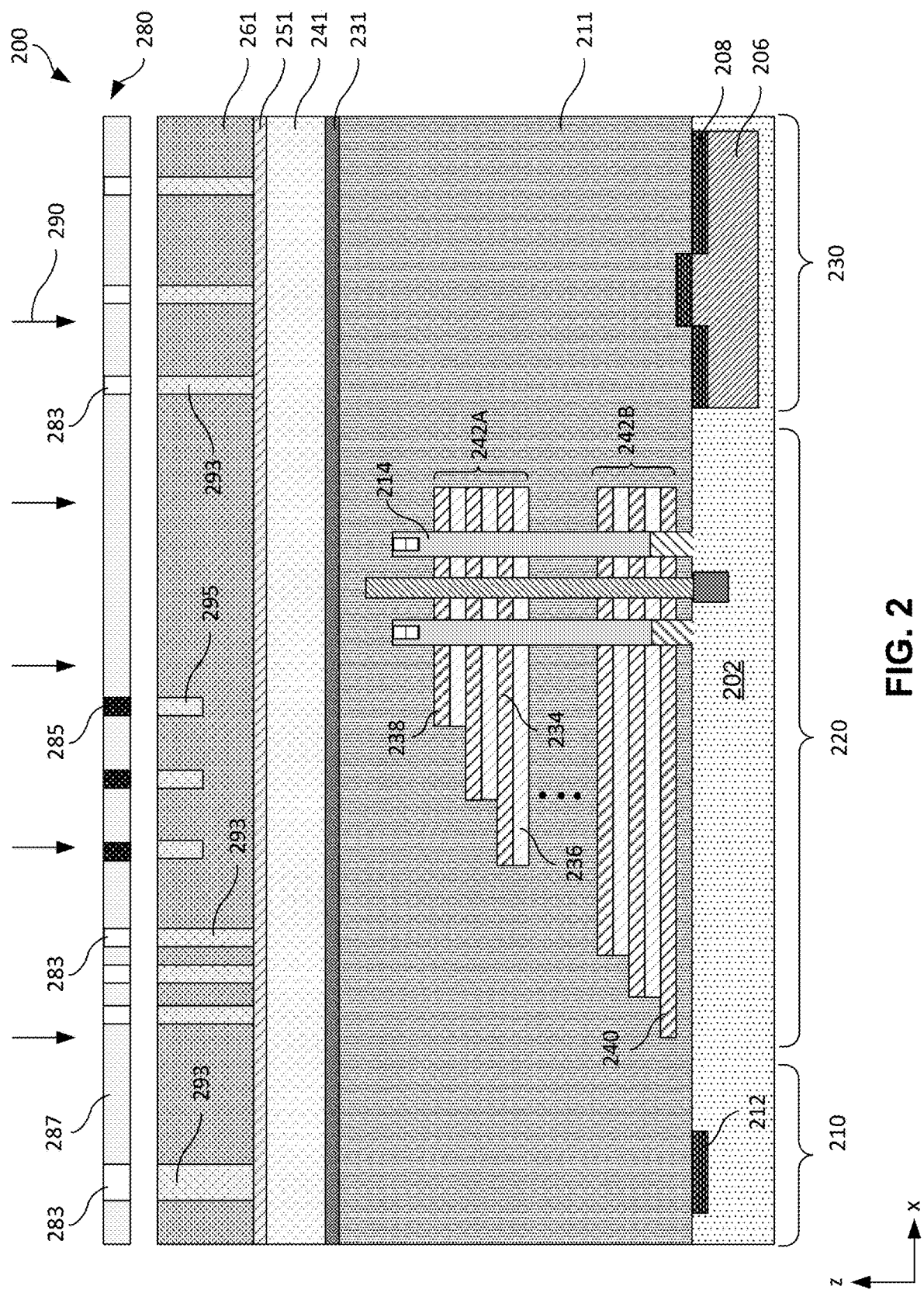
FIGS. 2-9 illustrate exemplary fabrication processes for forming contact structures in 3D NAND memory structures, in accordance with some embodiments of the present disclosure.

Referring to FIG. 10, at operation 1002, an exposing process uses a reticle to pattern a blocking layer of a partially fabricated 3D memory device, according to some embodiments. FIG. 2 illustrates a 3D NAND memory structure 200 having dielectric layers and various embedded semiconductor structures. 3D NAND memory structure 200 includes a substrate 202 and a dielectric layer 211. For ease of description, 3D NAND memory structure 200 can be divided into three regions: substrate contact region 210, staircase region 220, and peripheral device region 230.

Substrate 202 can include any suitable material for forming a 3D NAND memory structure. In some embodiments, substrate 202 can include silicon, silicon germanium, silicon carbide, silicon on insulator (SOI), germanium on insulator (GOI), glass, gallium nitride, gallium arsenide, any suitable III-V compound material, and/or combinations thereof. Dielectric layer 211 can be formed using any suitable dielectric material such as, for example, silicon oxide, silicon nitride, silicon oxynitride, and/or other suitable dielectric materials. The deposition of dielectric layer 211 can include any suitable methods such as chemical vapor deposition (CVD), physical vapor deposition (PVD), plasma-enhanced CVD (PECVD), sputtering, metal-organic chemical vapor deposition (MOCVD), atomic layer deposition (ALD), and/or combinations thereof. Dielectric layer 211 can include one or more etch stop layers (ESL) and are not illustrated for ease of description.

A substrate contact region 210 can include a contact pad 212 embedded in substrate 202. In some embodiments, contact pad 212 is formed using conductive material such as doped semiconductor material, metal, metal alloys, any suitable conductive material, and/or combinations thereof. For example, contact pad 212 can be formed using doped silicon, silicide, copper, aluminum, and any suitable conductive material. In some embodiments, contact pad 212 is optional.

A plurality of conductor layer 234 and dielectric layer 236 pairs are formed in staircase region 220. The plurality of conductor/dielectric layer pairs are also referred to herein as an "alternating conductor/dielectric stack". The alternating conductor/dielectric stack can include an upper level staircase structure 242A and a lower level staircase structure 242B. In some embodiments, the upper and lower level staircase structures 242A and 242B can each be a 32-level staircase structure. Upper level staircase structure 242A is formed over lower level staircase structure 242B. In some embodiments, the upper and lower level staircase structures 242A and 242B can include any suitable numbers of alternating conductor/dielectric pairs. Conductor layers 234 and dielectric layers 236 in the alternating conductor/dielectric stacks alternate in the vertical direction. In other words, except the ones at the top or bottom of upper and lower level staircase structures 242A and 242B, each conductor layer 234 can be adjoined by two dielectric layers 236 on both sides, and each dielectric layer 236 can be adjoined by two conductor layers 234 on both sides. Conductor layers 234 can each have the same thickness or have different thicknesses. Similarly, dielectric layers 236 can each have the same thickness or have different thicknesses. In some embodiments, upper level and lower level staircase structures 242A and 242B can include more conductor layers or more dielectric layers with different materials and/or thicknesses than the conductor/dielectric layer pair. Conductor layers 234 can include conductor materials including, but not limited to, W, Co, Cu, Al, doped silicon, silicide, or any combination thereof. Dielectric layers 236 can include dielectric materials including, but not limited to, silicon oxide, silicon nitride, silicon oxynitride, or any combination thereof.

3D NAND memory structure 200 further includes NAND strings 214 formed in staircase region 220 and include a plurality of control gates (each being part of a word line). Each conductor layer 234 in upper and lower level staircase structures 242A and 242B can act as a control gate for each memory cell of NAND string 214. Further, NAND strings 214 can include a select gate 238 (e.g., a drain select gate) at an upper end and another select gate 240 (e.g., a source select gate) at a lower end. As used herein, the "upper end" of a component (e.g., NAND string 214) is the end further away from substrate 202 in the z-direction, and the "lower end" of the component (e.g., NAND string 214) is the end closer to substrate 202 in the z-direction. In some embodiments, select gates 238 and 240 can include conductor materials including, but not limited to, W, Co, Cu, Al, doped silicon, silicides, or any combination thereof.

A peripheral device region 230 can be formed adjacent to staircase region 220. The peripheral device region 230 can include a plurality of peripheral devices 206 formed on or embedded in substrate 202, in which the entirety or part of the peripheral device is formed in substrate 202 (e.g., below the top surface of substrate 202) and/or directly on substrate 202. The peripheral devices 206 can include a plurality of transistors formed on substrate 202. Isolation regions and terminals 208 (e.g., a source region, a drain region, or a gate of the transistor) can be formed in substrate 202 as well.

In some embodiments, the peripheral device can include any suitable digital, analog, and/or mixed-signal peripheral circuits used for facilitating the operation of 3D NAND memory structure 200. For example, peripheral devices 206 can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors). In some embodiments, the peripheral device is formed on substrate 202 using complementary metal-oxide-semiconductor (CMOS) technology (also known as a "CMOS chip").

3D NAND memory structure 200 further includes contact structures in substrate contact region 210, staircase region 220, and peripheral device region 230. The contact structures are formed to provide electrical connections to devices embedded in substrate 202 and/or dielectric layer 211. For example, 3D NAND memory device can include one or more substrate contacts that extend through dielectric layer 211 and in physical contact with contact pad 212. 3D NAND memory device can also include one or more word line contacts in staircase region 220. Word line contacts can extend vertically within dielectric layer 211. Each word line contact can have an end (e.g., the lower end) in contact with a corresponding conductor layer 234 in upper level staircase structure 242A and lower level staircase structure 242B to individually address a corresponding word line of the array device.

3D NAND memory structure 200 can also include peripheral interconnect structures above peripheral devices 206 to transfer electrical signals to and from peripheral devices 206. Peripheral interconnect structures can include one or more contacts and conductor layers, each including one or more interconnect lines and/or vias. As used herein, the term "contact" can broadly include any suitable types of interconnects, such as middle-end-of-line (MEOL) interconnects and back-end-of-line (BEOL) interconnects, including vertical interconnect accesses (e.g., vias) and lateral lines (e.g., interconnect lines).

A first etch stop layer (ESL) 231 can be formed on a top surface of dielectric layer 211. In some embodiments, first ESL 231 can be formed of any suitable dielectric material, such as silicon oxide, silicon nitride, silicon oxynitride, and/or combinations thereof. In some embodiments, first ESL 231 is formed using tetraethoxysilane (TEOS). In some embodiments, first ESL 231 can have a thickness between about 600 Å and about 1000 Å.

A hard mask layer 241 is formed on a top surface of first ESL 231. In some embodiments, hard mask layer 241 can be formed using a dielectric material that is different from first ESL 231 to achieve greater etch selectivity. For example, hard mask layer 241 can be formed using silicon nitride and first ESL can be formed using silicon oxide. In some embodiments, hard mask layer 241 can be formed using any suitable dielectric material, such as silicon oxynitride, silicon carbide, silicon oxycarbide, silicon nitride, and/or combinations thereof. In some embodiments, hard mask layer 241 can have a thickness between about 1500 Å and about 3000 Å.

A second ESL 251 can be formed on a top surface of hard mask layer 241. Second ESL 251 can be formed using a dielectric material that is different from hard mask layer 241. For example, second ESL 251 can be formed using silicon oxynitride and hard mask layer 241 can be formed using silicon nitride. In some embodiments, second ESL 251 can have a thickness between about 500 a and about 1000 Å.

Blocking layer 261 can be formed on a top surface of second ESL 251. In some embodiments, blocking layer 261 contains photoresist material. In some embodiments, blocking layer can be formed using any suitable blocking material. According to the reaction mechanism of a photoresist layer, a photoacid generator generates acid when it is illuminated by a light source of a photolithography apparatus, and the main chain or branched chain of the resin reacts with the generated acid to be decomposed or crosslinked. A reticle is positioned between the photoresist layer and the light source, such that light emitted by the light source only transmits through transparent portions of the reticle onto portions of the photoresist layer. The polarity change of the resin within the photoresist layer induces solubility differences between the exposed portion and unexposed portion in the developing solution, to form a predetermined pattern contoured by the transparent portions of the reticle. In some embodiments, blocking layer 261 can have a thickness between about 1 μm and about 5 μm.

To form substrate contacts, word line contacts, and peripheral interconnect structures, openings are first formed in dielectric layer 211 to expose substrate 202, the corresponding word line of the array device and/or terminals 208 of peripheral devices 206. Openings can be formed by a photolithography process followed by a series of etching processes.

An exemplary photolithography process is shown in FIG. 2. The photolithography process is configured such that blocking layer 261 can be fully exposed in a first selection of areas, partially exposed in a second selection of areas, and not exposed in a third selection of areas. For example, a reticle can include transparent regions, semi-transparent regions, and opaque regions. During a photolithography process, reticle 280 is positioned above 3D NAND memory structure 200 (this figure is not to scale, and as such, does not illustrate the actual distance the reticle is positioned with respect to the structure 200, as would be appreciated by a person of ordinary skill in the art). Reticle 280 can contain transparent regions 283, semi-transparent regions 285, and opaque regions 287. Light 290 emitted from a light source (not shown in FIG. 2) is exerted upon one side of reticle 280. Light 290 can be radiation of suitable wavelengths, such as UV radiation, extreme UV (EUV) radiation, or any suitable radiation. Light 290 can transmit through transparent regions 283 without reduction in intensity or suffer little reduction in intensity. For example, the light intensity can reduce about 1% to about 5% after light 290 passes through transparent region 283 of reticle 280. In some embodiments, transparent region can include mechanisms for enhancing light transmission and reducing intensity loss. For example, a transmission-enhancing film (not shown in FIG. 2) can be formed on reticle 280 in transparent regions 283. In contrast, semi-transparent region 285 is configured to allow a specific amount of light to pass through. For example, after light 290 passes through semi-transparent regions 285, light intensity can be reduced to between about 30% to about 60%. In some embodiments, light intensity can be reduced to between about 45% to about 55%. Opaque regions 287 blocks light 290 entirely. Semi-transparent region 285 can be formed using any suitable methods. For example, a film (not shown in FIG. 2) can be formed on reticle 280 and in semi-transparent region 285 to reduce light transmission. One or more properties of the film (e.g., thickness, chemical composition, color) can be configured to absorb light having a certain range of wavelength. In some embodiments, semi-transparent regions 285 can reduce light transmission by using phase-shifting films. In some embodiments, the film is configured to reduce intensity of light regardless of its wavelength. Opaque regions 287 can block transmission of light 290 by using an opaque metallic film, such as chromium.

Light 290 transmitted through transparent regions 283 and semi-transparent regions 285 reacts with blocking layer 261. In some embodiments, blocking layer can be formed using photoresist material. According to the reaction mechanism of the photoresist layer, portions of the photoresist material react with the generated acid to be decomposed or cross-linked. Due to different light intensity of light 291 received in different portions of the photoresist material, the reacted portions have varied penetration depths into blocking layer 261. For example, full-depth portions 293 under transparent regions 283 extend through the entire thickness of blocking layer 261. Mid-depth portions extend 295 are under semi-transparent regions 285 and extend only a portion of the thickness of blocking layer 261.

Figure 3:
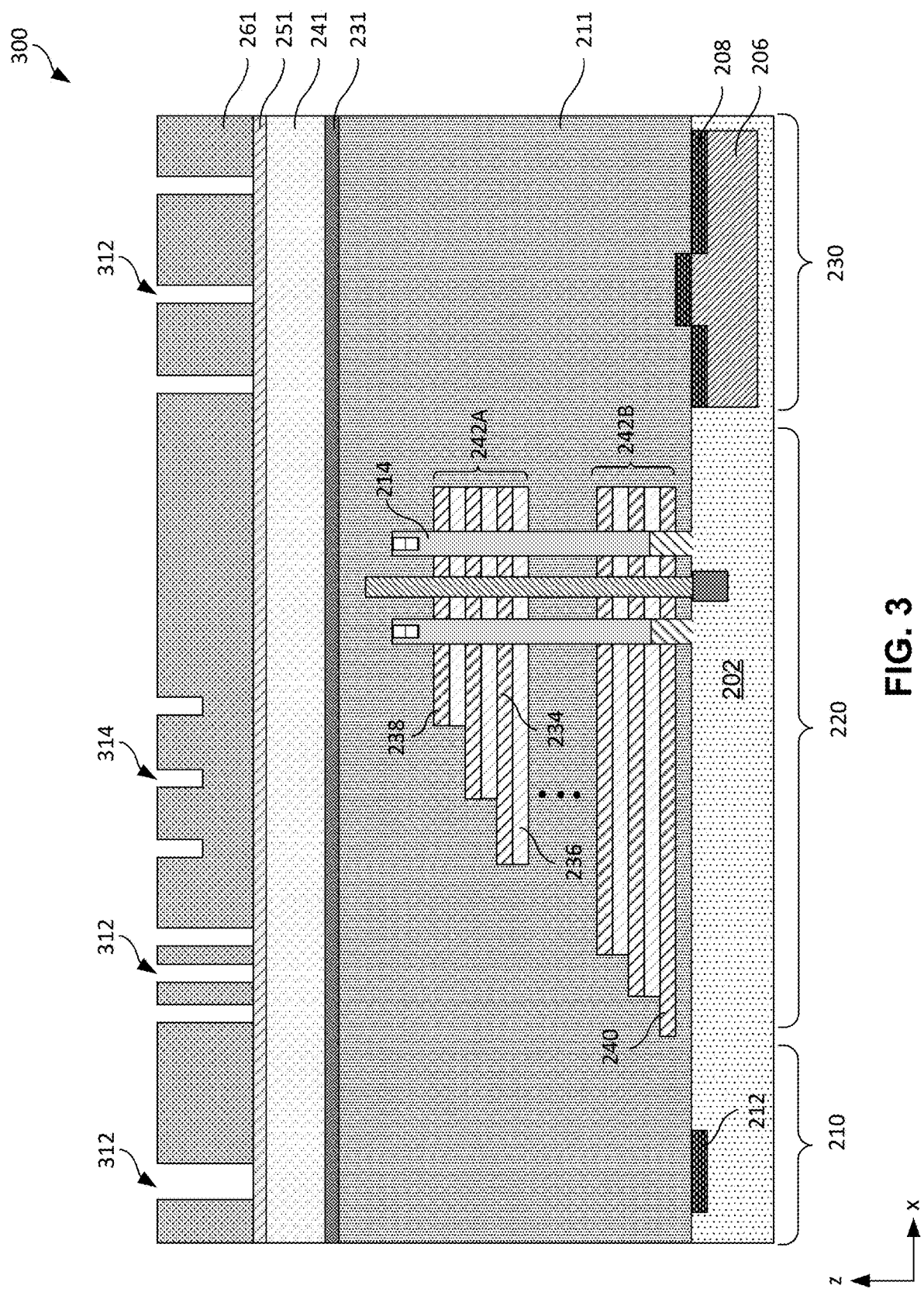

Referring to FIG. 10, at operation 1004, first and second plurality of openings are formed in the blocking layer, according to some embodiments. FIG. 3 illustrates a 3D NAND memory structure 300 having a first plurality of openings 312 that extend through the entire blocking layer 261 and revealing a portion of the underlying structure and a second plurality of openings 314 that extend through a portion of the entire thickness of blocking layer 261 without revealing the underlying structure. During the exposure process of photolithography, the polarity change of the resin within the photoresist layer induces solubility differences between the exposed portion and unexposed portion in the developing solution such that exposed portion are removed to form openings in blocking layer 261. In some embodiments, openings 314 can have a depth that is between about 30% and about 60% of the thickness of blocking layer 261. First plurality of openings 312 are formed over contact pad 212 in substrate contact region 210, over lower level staircase structure 242B in staircase region 220, and/or over peripheral device region 230. Second plurality of openings 314 are formed above upper level staircase structure 242A in staircase region 220.

Referring to FIG. 10, at operation 1006, a series of etching processes form openings in the partially fabricated three-dimensional memory device, according to some embodiments. FIGS. 4-8 illustrate 3D NAND memory structure 400-800 undergoing a series of etching processes to form openings for contact structures.

Figure 4:
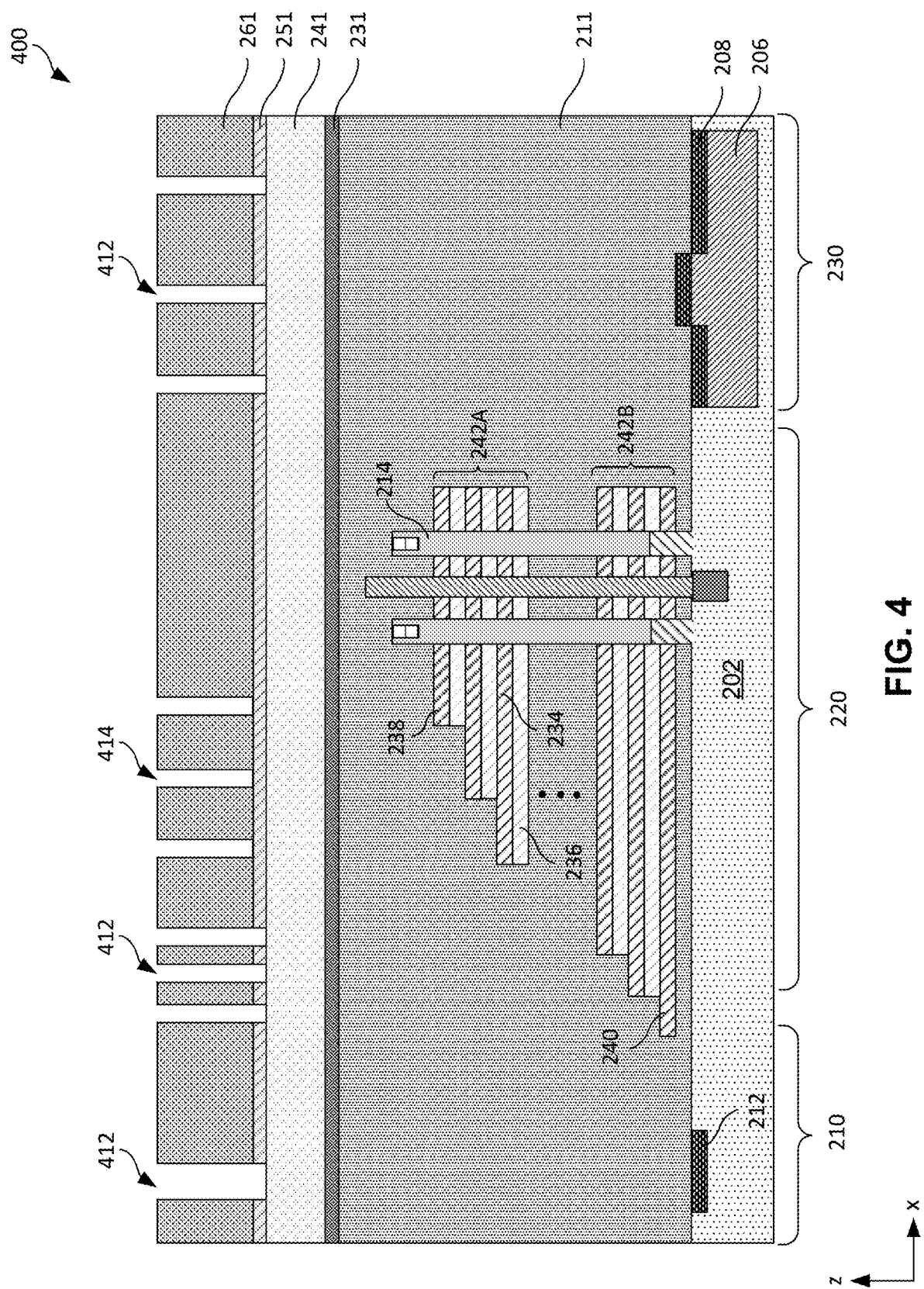

FIG. 4 illustrates a 3D NAND memory structure 400 after a first etching process. Patterned blocking layer 261 can protect regions of second ESL 251 covered by blocking layer 261 while the first etching process removes exposed ESL 251. The first etching process continues until all exposed ESL 251 is removed in first plurality of openings 312 and underlying hard mask layer 241 is exposed. As such, first plurality of openings 312 are extended to become first plurality of openings 412. In some embodiments, photoresist material of blocking layer 261 can remain in second plurality of openings 314 without exposing underlying second ESL 251. In some embodiments, the first etching process can be a plasma etching process that also removes photoresist material at a much slower rate than the etching rate of second ESL 251. In such case, second ESL 251 can be exposed in second plurality of openings 314 and thus partially etched or remain covered by blocking layer 261. As such second plurality of openings 314 are extended to become second plurality of openings 414. Nonetheless, after the first etching process, second ESL 251 is removed in first plurality of openings 412 and at least a portion of ESL 251 remains in second plurality of openings 414. The first etching process can utilize any suitable etching process, such as dry plasma etching or wet chemical etching. The first etching process can be etching process suitable for removing material that forms second ESL 251. For example, the first etching process can be a plasma etching process configured to remove silicon oxynitride.

Figure 5:
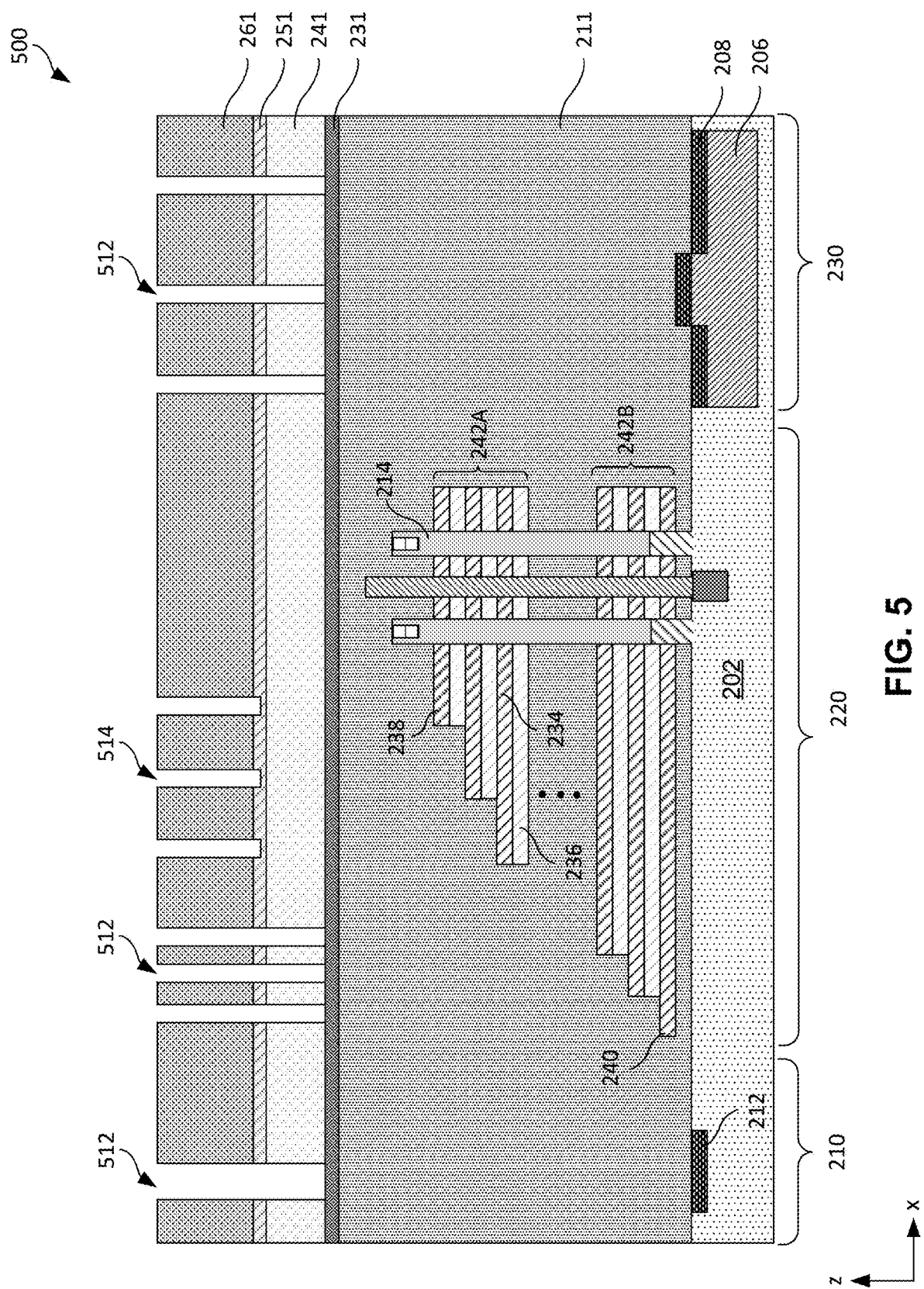

FIG. 5 illustrates a 3D NAND memory structure 500 after a second etching process. The second etching process is configured to remove material that formed hard mask layer 241. After the second etching process, first and second plurality of openings 412 and 414 of FIG. 4 are extended to respectively form first and second plurality of openings 512 and 514. Hard mask layer 241 can be formed using silicon nitride and the second etching process can be a plasma etching process that utilizes a gas mixture of tetrafluoromethane, sulfur hexafluoride, oxygen, hydrogen, nitrogen, any suitable etching gas, and/or combinations thereof. In some embodiments, the etching process can be a wet chemical etching process. Hard mask layer 241 exposed in first plurality of openings 512 after the first etching process can be removed after the second etching process. The second etching process continues until underlying first ESL 231 is exposed in first plurality of openings 512. In some embodiments, second ESL 251 can also be partially etched in second plurality of openings 514, as shown in FIG. 5. In some embodiments, second ESL 251 remains intact after the second etching process.

Figure 6:
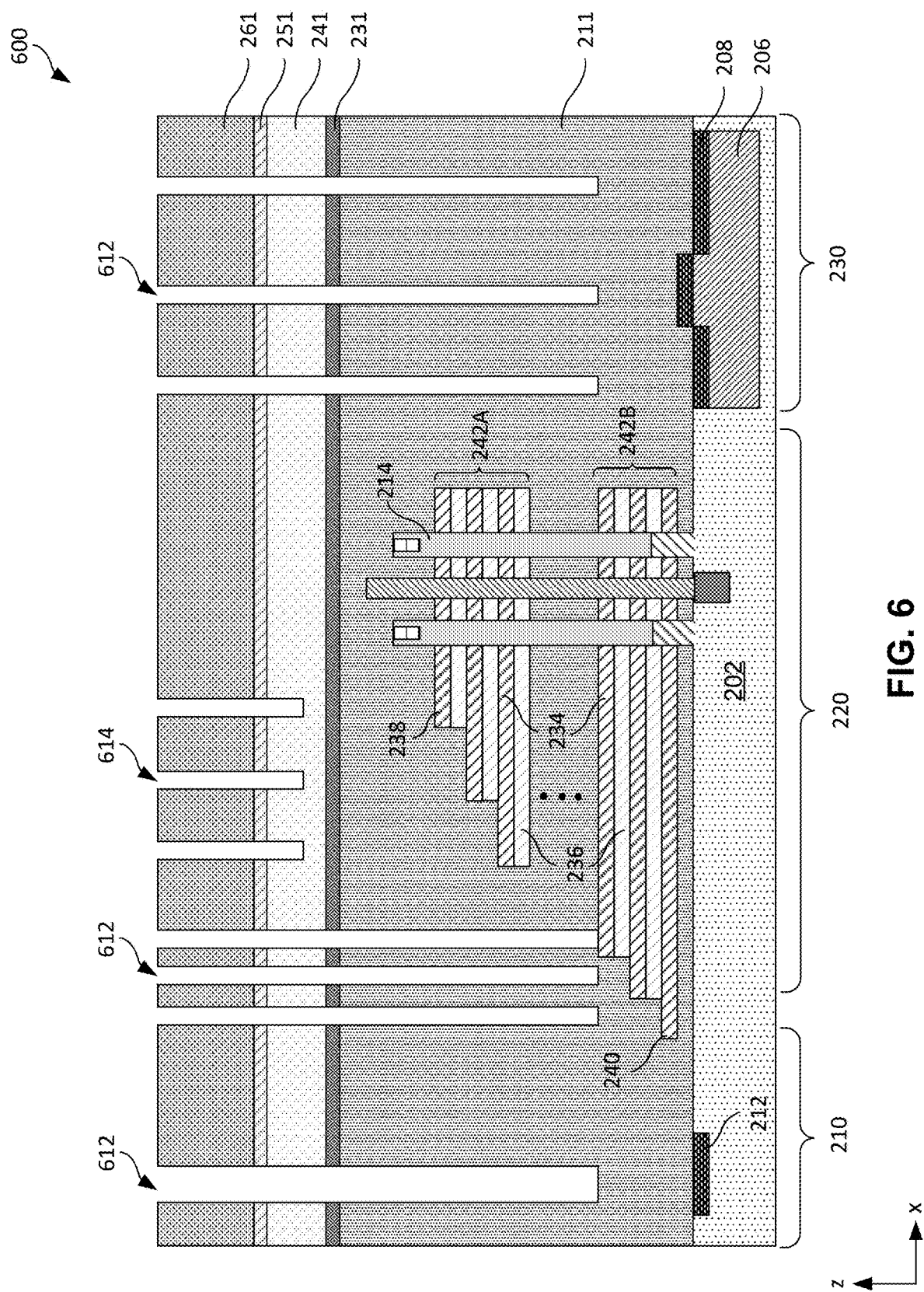

FIG. 6 illustrates a 3D NAND memory structure 600 after a third etching process. After the third etching process, first and second plurality of openings 512 and 514 of FIG. 5 are extended to respectively form first and second plurality of openings 612 and 614. The third etching process is configured to remove the first ESL 231 and dielectric layer 211. In some embodiments, first ESL 231 and dielectric layer 211 are both formed using silicon oxide. The third etching process can be a plasma etching process that utilizes a gas mixture of octafluorocyclobutane, sulfur hexafluoride, oxygen, hydrogen, nitrogen, any suitable etching gas, and/or combinations thereof. In some embodiments, the etching process can be a wet chemical etching process. First ESL 231 and dielectric layer 211 exposed in first plurality of openings 612 after the second etching process can be removed after the third etching process. In some embodiments, the third etching process continues until the top most conductive layer 234 of lower level staircase structure 242B is exposed in one of the openings of first plurality of openings 612. In some embodiments, the third etching process can be stopped prior to the exposure of conductive layer 234. During the third etching process, second plurality of openings 614 can extend through second ESL 251 and into hard mask layer 241, as shown in FIG. 6. In some embodiments, second ESL 251 remains intact after the second etching process.

Figure 7:
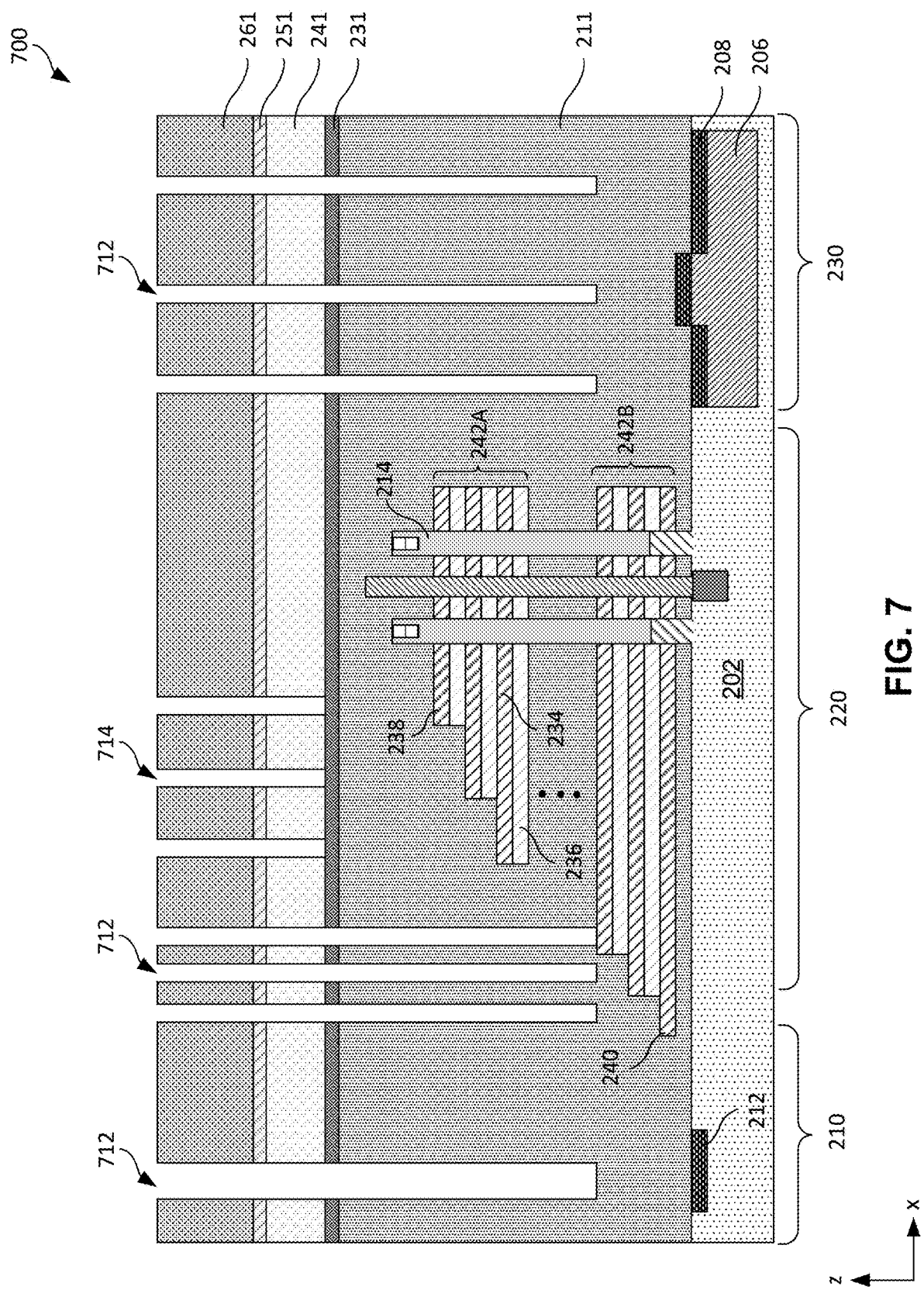

FIG. 7 illustrates a 3D NAND memory structure 700 after a fourth etching process. After the fourth etching process, first and second plurality of openings 612 and 614 of FIG. 6 are extended to respectively form first and second plurality of openings 712 and 714. The fourth etching process is configured to remove material in second plurality of openings 714. For example, the fourth etching process can be configured to remove portions of hard mask layer 241 in second plurality of openings 714. As hard mask layer 241 and dielectric layer 211 can be formed using different material that has high etching selectivity over one another, hard mask layer 241 can be removed in second plurality of openings 714 while dielectric layer 211 can remain substantially intact during the fourth etching process. In some embodiments, fourth etching process can use etching methods that are similar to that of the second etching process. The fourth etching process can continue until hard mask layer 241 is removed and second ESL 231 is exposed in second plurality of openings 714.

Figure 8:
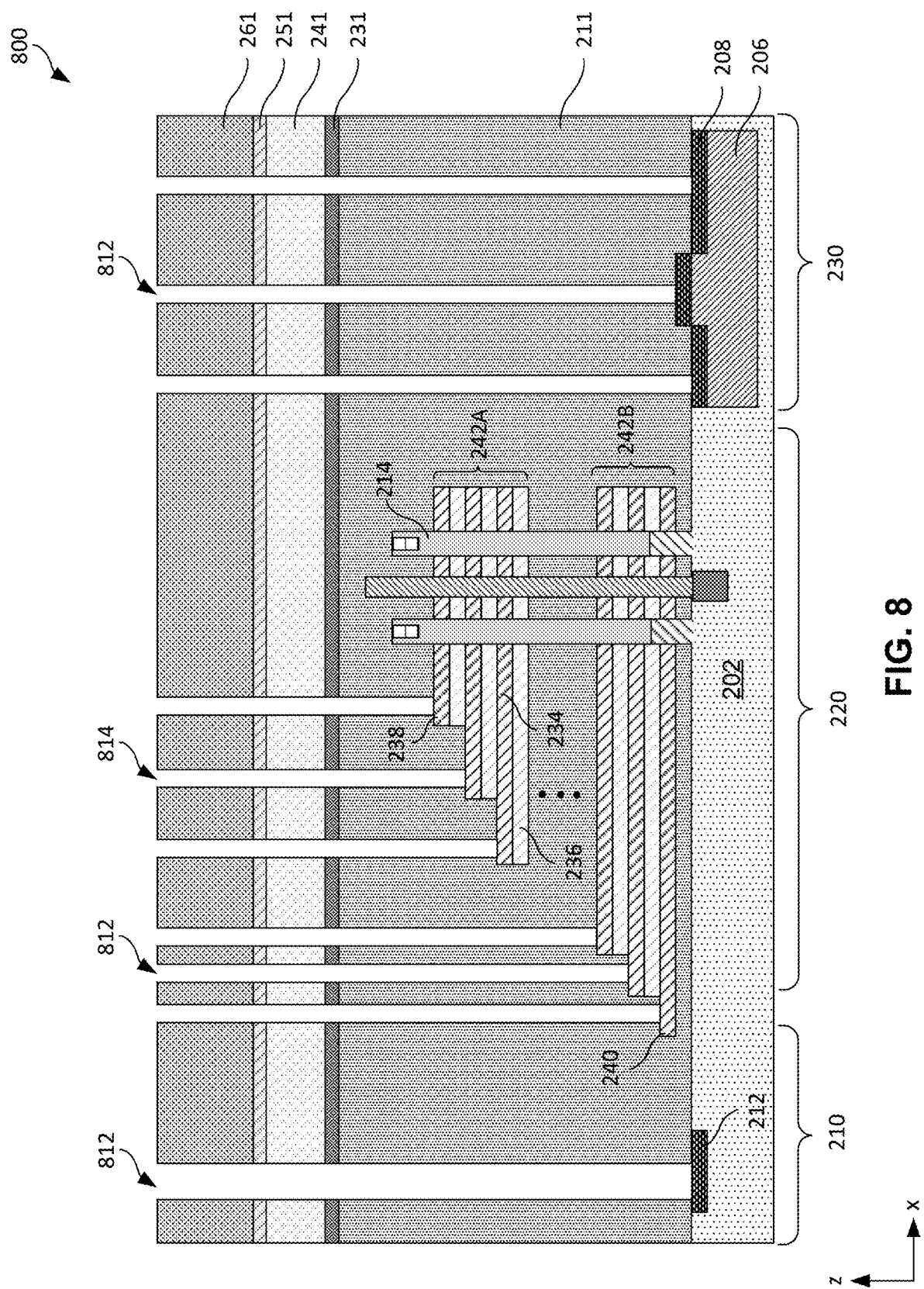

FIG. 8 illustrates a 3D NAND memory structure 800 after a fifth etching process. After the second etching process, first and second plurality of openings 712 and 714 of FIG. 7 are extended to respectively form first and second plurality of openings 812 and 814. The fifth etching process is configured to remove material in both the first and second pluralities of openings 812 and 814. For example, the fifth etching process can be configured to remove portions of dielectric layer 211 in first plurality of openings 812 and first ESL 231 in second plurality of openings 814. The fifth etching process can be configured to remove materials that form first ESL 231 and dielectric layer 211. For example, the fifth etching process can be configured to remove silicon oxide material. In some embodiments, the fifth etching process can continue until underlying material is exposed. For example, contact pad 212 can be exposed in substrate contact region 210 and terminals 208 are exposed in peripheral region 230 after the fifth etching process. In some embodiments, conductive layers 234 for both upper and lower level staircase structures 242A and 242B are exposed in the openings, as shown in FIG. 8.

Referring to FIG. 10, at operation 1008, the openings are filled with conductive material to form contacts, according to some embodiments. FIG. 9 illustrates a 3D NAND memory structure 900 after conductive material is deposited into first and second plurality of openings 812 and 814. In some embodiments, blocking layer 261 is removed via suitable processes before conductive material is being deposited. In some embodiments, second ESL 251, hard mask layer 241, and first ESL 231 are also removed. In some embodiments, the etch stop layers and the hard mask layer remain on dielectric layer 211 to protect the underlying structures. In some embodiments, after the conductive material is deposited, substrate contact 902 and conductor structures 922 are formed to be in physical contact with contact pads 212 and terminals 208, respectively. In staircase region 220, word line contacts 912 are formed to be in physical contact with conductive layers 234 of lower level staircase structure 242B. Word line contacts 914 are formed to be in physical contact with conductive layers 234 of upper level staircase structure 242A. Substrate contact 902, word line contacts 912 and 914, and conductor structures 922 can be formed by disposing a conductive material in first and second pluralities of openings 812 and 814 until the openings are completely filled. In some embodiments, the conductive material can overflow onto the top surface of second ESL 251. In some embodiments, a planarization process such as a chemical mechanical polishing process can be used to remove the overflow conductive material such that the top surfaces of ESL 251 and the contact structures are substantially level (e.g., coplanar). The contact structures such as substrate contact 902, word line contacts 912 and 914, and conductor structures 922 can include conductor materials including, but not limited to, tungsten (W), cobalt (Co), copper (Cu), aluminum (Al), silicides, or any combination thereof. In some embodiments, the conductive material can be disposed using any suitable deposition method such as, for example, for example, CVD, PVD, PECVD, sputtering, MOCVD, ALD, and/or combinations thereof. In some embodiments, other layers such as barrier layers, liners, can be disposed in the openings and are not illustrated for ease of description.

Embodiments described herein are directed to contacting structures of a 3D NAND memory device and fabricating methods of the same. The exemplary fabrication method includes forming multiple openings such as target via holes in staircase regions, periphery device regions, and substrate contact regions of a 3D NAND memory device. The openings can be formed by a photolithography process followed by multiple etching processes. The photolithography process can utilize various methods to form a plurality of openings in a photoresist layer and the openings can include complete openings that expose the underlying layer and mid-way openings where a remaining portion of the photoresist still exists between the opening and the underlying layer. The remaining portion of the photoresist can delay the etching process in the shorter openings for the upper level staircase structure during the formation of the deeper openings for the lower level staircase structure. Conductive material is deposited into the openings to form contact structures for structures such as substrate contact pads, upper and lower level staircase structures, and/or peripheral devices.

In some embodiments, a method for forming a three-dimensional (3D) memory structure includes forming a dielectric layer on a substrate and forming upper level and lower level staircase structures in the dielectric layer. The method also includes disposing a first etch stop layer (ESL) on the dielectric layer and disposing a hard mask layer on the first ESL. The method further includes disposing a second ESL on the hard mask layer. The method also includes performing a first etching process to form a first plurality of openings in the second ESL, wherein the first plurality of openings are formed above the lower level staircase structure. The method also includes performing a second etching process that includes extending the first plurality of openings into the hard mask layer and forming a second plurality of openings in the second ESL. The second plurality of openings are formed above the upper and lower level staircase structures. The method also includes performing a third etching process that includes extending the first plurality of openings into the dielectric layer until a topmost conductive layer of the lower level staircase structure is exposed in an opening of the first plurality of openings. The method further includes extending the second plurality of openings into the hard mask layer and performing a fourth etching process to etch a portion of the hard mask layer until the first ESL is exposed in the second plurality of openings. The method also includes performing a fifth etching process that includes extending the first plurality of openings such that each opening of the first plurality of openings is in physical contact with a corresponding conductive layer of the lower level staircase structure. The method also includes extending the second plurality of openings such that each opening of the second plurality of openings is in physical contact with a corresponding conductive layer of the upper level staircase structure.

In some embodiments, a method for forming a three-dimensional (3D) memory structure includes forming a dielectric layer on a substrate and forming upper level and lower level staircase structures in the dielectric layer. The method also includes disposing a photoresist layer on the dielectric layer and exposing the photoresist layer under a reticle. The reticle includes transparent regions over the lower level staircase structures, semi-transparent regions over the upper level staircase structures, and opaque regions. The method further includes forming a first plurality of openings in the photoresist layer under the transparent regions, wherein the first plurality of openings have a depth that is about equal to a thickness of the photoresist layer. The method further includes forming a second plurality of openings in the photoresist layer under the semi-transparent regions, wherein the second plurality of openings have a depth that is less than the thickness of the photoresist layer. The method further includes performing one or more etching processes that includes extending the first plurality of openings and exposing conductive layers of the lower level staircase structures in the first plurality of openings and extending the second plurality of openings and exposing conductive layers of the upper level staircase structures in the second plurality of openings. The method further includes disposing conductive material in the first and second pluralities of openings and on the conductive layers of the lower and upper level staircase structures, respectively.

In some embodiments, a method for forming a three-dimensional (3D) memory structure includes forming a dielectric layer on a substrate and forming a contact pad in the substrate. The method also includes forming staircase structures in the dielectric layer and disposing a photoresist layer on the dielectric layer. The method further includes exposing the photoresist layer under a reticle, wherein the reticle comprises transparent regions over the contact pad and semi-transparent regions over the staircase structures. The method also includes forming a first plurality of openings in the photoresist layer under the transparent regions, wherein the first plurality of openings have a depth that is about equal to a thickness of the photoresist layer. The method further includes forming a second plurality of openings in the photoresist layer under the semi-transparent regions, wherein the second plurality of openings have a depth that is less than the thickness of the photoresist layer. The method further includes performing one or more etching processes that includes extending the first plurality of openings and exposing the contact pad in the first plurality of openings and extending the second plurality of openings and exposing conductive layers of the staircase structures in the second plurality of openings. The method also includes disposing conductive material in the first and second pluralities of openings.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory structure, comprising:
   forming a dielectric layer on a substrate;
   forming upper level and lower level staircase structures in the dielectric layer;
   disposing a first etch stop layer (ESL) on the dielectric layer;
   disposing a hard mask layer on the first ESL;
   disposing a second ESL on the hard mask layer;
   performing a first etching process to form a first plurality of openings in the second ESL, wherein the first plurality of openings are formed above the lower level staircase structure;
   performing a second etching process, comprising:
   extending the first plurality of openings into the hard mask layer; and
   forming a second plurality of openings in the second ESL, wherein the second plurality of openings are formed above the upper and lower level staircase structures; and
   performing additional sequential etching processes, comprising:
   exposing the hard mask layer, the first ESL, and the dielectric layer in the first plurality of openings and in the second plurality of openings.

2. The method of claim 1, wherein performing the additional etching processes comprises:
   performing a third etching process, comprising:
   extending the first plurality of openings into the dielectric layer until a topmost conductive layer of the lower level staircase structure is exposed in an opening of the first plurality of openings; and
   extending the second plurality of openings into the hard mask layer;
   performing a fourth etching process to etch a portion of the hard mask layer until the first ESL is exposed in the second plurality of openings; and
   performing a fifth etching process, comprising:
   extending the first plurality of openings such that each opening of the first plurality of openings is in physical contact with a corresponding conductive layer of the lower level staircase structure; and
   extending the second plurality of openings such that each opening of the second plurality of openings is in physical contact with a corresponding conductive layer of the upper level staircase structure.

3. The method of claim 2, wherein performing the third etching process comprises extending the first plurality of openings through the first ESL.

4. The method of claim 2, wherein performing the fourth etching process comprises etching through the hard mask layer in the second plurality of openings.

5. The method of claim 1, further comprising disposing conductive material in the first and second pluralities of openings to form word line contacts for the lower and upper level staircase structures.

6. The method of claim 5, further comprising performing a planarization process on the second ESL and the disposed conductive material.

7. The method of claim 1, further comprising forming a photoresist layer on the second ESL and exposing the photoresist layer under a reticle.

8. The method of claim 7, wherein the reticle comprises transparent regions, semi-transparent regions, and opaque regions.

9. The method of claim 8, further comprising:
forming a first plurality of photoresist openings under the transparent regions of the reticle, wherein the first plurality of photoresist openings have a first depth that is about equal to a thickness of the photoresist layer; and
forming a second plurality of photoresist openings under the semi-transparent regions, wherein the second plurality of photoresist openings have a second depth that is less than the thickness of the photoresist layer.

10. The method of claim 9, wherein performing the first etching process comprises removing portions of the second ESL through the first plurality of photoresist openings.

11. The method of claim 9, further comprising extending the second plurality of photoresist openings to expose portions of the second ESL, and wherein performing the second etching process comprises removing the exposed portions of the second ESL.

12. A method for forming a three-dimensional (3D) memory structure, comprising:
forming a dielectric layer on a substrate;
forming upper level and lower level staircase structures in the dielectric layer;
disposing a photoresist layer on the dielectric layer;
exposing the photoresist layer under a reticle, wherein the reticle comprises transparent regions over the lower level staircase structures, semi-transparent regions over the upper level staircase structures, and opaque regions;
forming a first plurality of openings in the photoresist layer under the transparent regions, wherein the first plurality of openings have a depth that is about equal to a thickness of the photoresist layer;
forming a second plurality of openings in the photoresist layer under the semi-transparent regions, wherein the second plurality of openings have a depth that is less than the thickness of the photoresist layer;
performing one or more etching processes, comprising:
exposing the dielectric layer in the first plurality of openings and in the second plurality of openings; and
disposing conductive material in the first and second pluralities of openings and on conductive layers of the lower and upper level staircase structures, respectively.

13. The method of claim 12, further comprising:
extending the first plurality of openings and exposing conductive layers of the lower level staircase structures in the first plurality of openings; and
extending the second plurality of openings and exposing conductive layers of the upper level staircase structures in the second plurality of openings.

14. The method of claim 12, further comprising forming a contact pad in the substrate and performing the one or more etching processes comprises exposing the contact pad through at least one opening of the first plurality of openings.

15. The method of claim 12, further comprising forming terminals of a semiconductor device in the substrate and performing the one or more etching processes comprises exposing the terminals through at least one opening of the first plurality of openings.

16. The method of claim 12, further comprising disposing an etch stop layer over the dielectric layer, and the one or more etching processes comprise a first etching process to remove a portion of the etch stop layer through the first plurality of openings and to extend the second plurality of openings through the photoresist layer.

17. The method of claim 16, further comprising disposing a hard mask layer over the dielectric layer, and the one or more etching processes comprise a second etching process to extend the first plurality of openings through the hard mask layer and to remove a portion of the etch stop layer through the second plurality of openings.

18. A method for forming a three-dimensional (3D) memory structure, comprising:
forming a dielectric layer on a substrate;
forming a contact pad in the substrate;
forming staircase structures in the dielectric layer;
disposing a photoresist layer on the dielectric layer;
exposing the photoresist layer under a reticle, wherein the reticle comprises transparent regions over the contact pad and semi-transparent regions over the staircase structures;
forming a first plurality of openings in the photoresist layer under the transparent regions, wherein the first plurality of openings have a depth that is about equal to a thickness of the photoresist layer;
forming a second plurality of openings in the photoresist layer under the semi-transparent regions, wherein the second plurality of openings have a depth that is less than the thickness of the photoresist layer;
performing one or more etching processes, comprising:
extending the first plurality of openings and exposing the contact pad in an opening of the first plurality of openings; and
extending the second plurality of openings and exposing conductive layers of the staircase structures in the second plurality of openings; and
disposing conductive material in the first and second pluralities of openings.

19. The method of claim 18, further comprising forming terminals of a semiconductor device in the substrate and performing the one or more etching processes comprises exposing the terminals through at least one opening of the first plurality of openings.

20. The method of claim 18, further comprising disposing an etch stop layer over the dielectric layer, and the one or more etching processes comprise a first etching process to remove a portion of the etch stop layer through the first plurality of openings and to extend the second plurality of openings through the photoresist layer.

21. The method of claim 20, further comprising disposing a hard mask layer over the dielectric layer and the one or more etching processes comprise a second etching process to extend the first plurality of openings through the hard mask layer and to remove a portion of the etch stop layer through the second plurality of openings.

22. The method of claim 21, wherein the second etching process further comprises removing the hard mask layer from the first plurality of openings and at least partially removing the second etch stop layer from the second plurality of openings.

* * * * *